US006225931B1

United States Patent
Rao et al.

(10) Patent No.: US 6,225,931 B1
(45) Date of Patent: May 1, 2001

(54) D/A CONVERTER WITH A GAMMA CORRECTION CIRCUIT

(75) Inventors: Yong-Nien Rao, Taichung; Chia-Yuan Chang, Hsichu, both of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/385,831

(22) Filed: Aug. 30, 1999

(51) Int. Cl.$^7$ .................................................. H03M 1/88

(52) U.S. Cl. ................................................................ 341/144

(58) Field of Search ................................ 341/150, 144, 341/145, 154, 138

(56) References Cited

U.S. PATENT DOCUMENTS 5,877,717 * 3/1999 Tu ......................................... 341/150
6,046,719 * 4/2000 Dingwall ............................... 341/150

* cited by examiner

*Primary Examiner*—Brian Young
(74) *Attorney, Agent, or Firm*—W. Wayne Liauh

(57) ABSTRACT

A D/A converter with a Gamma correction circuit according to the invention is designed for C-DAC which utilizes multiplexers to obtain reference voltages. This D/A converter takes up much less space and has more simple structure than the conventional R-DAC and 2-divided C-DAC. Therefore, this D/A converter has advantages of simple design and low cost. Furthermore, users can freely define the shape of a Gamma correction conversion curve to thereby widen application areas by adjusting terminal voltages.

10 Claims, 4 Drawing Sheets

D/A CONVERTER WITH A GAMMA CORRECTION CIRCUIT

FIELD OF THE INVENTION

The invention relates to a D/A converter with a Gamma correction circuit, and in particular to a D/A converter with a Gamma correction circuit which is utilized for compensation in liquid-crystal display (LCD) applications.

BACKGROUND OF THE INVENTION

Generally, in a conventional digital-to-analog converter (DAC), an output voltage is required to have a linear relation with the digital data input. However, in certain special cases, an output voltage of the DAC must have a non-linear relation with the digital data input. For example, in liquid-crystal display (LCD) applications, the relation between the brightness and voltage of an LCD is not linear. Therefore, a correction circuit generally called a Gamma correction circuit which is utilized for compensation should be added into the DAC circuit. However, a conventional DAC with a Gamma correction circuit takes up so much space that it occupies most of the area of a data driver. FIG. 1 shows the structure of a R-DAC with a Gamma correction circuit according to the prior art. In this conventional R-DAC, digital data D0~D5 are decoded by the use of a ROM decoder 11, and then a voltage-dividing resistor 121 is selected from a reference voltage generator 12 to output a corresponding voltage. The above-mentioned approach is simple, but taking an LCD application as an example, the number of gray levels varies directly with the space occupied by its structure. For example, the area of the R-DAC with 256 gray levels is 5.3 times that of the R-DAC with 64 gray levels.

FIG. 2 is a circuit diagram of a 2-divided C-DAC with a Gamma correction circuit, including switch 13 and capacitor 14 corresponding to digital data input. Even though the area of the 2-divided C-DAC is smaller than that of the R-DAC, many capacitors which take up a large area are used. Therefore, the area of the 2-divided C-DAC can be further reduced.

SUMMARY OF THE INVENTION

Accordingly, the main object of the invention is to provide a D/A converter with a Gamma correction circuit which has a simple structure, and the area of which is much smaller than those of the conventional R-DAC and 2-divided C-DAC. Therefore, its circuit design is simplified and the manufacturing cost is reduced. Besides, the shape of a Gamma correction conversion curve can be freely defined by users by adjusting their terminal voltages, thereby enhancing the range of applications.

To attain this above object, a D/A converter with a Gamma correction circuit according to the invention which receives N-bit digital data and outputs a corresponding analog voltage, comprises:

a plurality of terminal voltage sources, wherein nine reference terminal voltage sources $V_8$~$V_0$ are defined by users;

a first terminal voltage selector and a second voltage selector, the terminals of which are connected to the plurality of terminal voltage sources respectively for the use of decoding the k highest bits ($d_{n-1}$~$d_{n-k}$) of the n-bit digital data to obtain a first reference voltage (Vh) and a second reference voltage (V1) from $V_8$~$V_1$ and $V_7$~$V_0$;

a voltage selector, the terminals of which receive the first reference voltage and the second reference voltage respectively, wherein a first selecting switch (SELp) and a second selecting switch (SELn) decide a voltage difference between the first reference voltage and the second reference voltage by inputting the n-k lowest bits of the n-bit digital data in ascending order;

a first switch, a second switch and a third switch connected to each other in series and coupled between the output terminal of the voltage selector and the second reference voltage (V1);

a first capacitor, which is a charging capacitor, connected to the voltage selector in parallel; and a second capacitor, which is a re-distributing capacitor, connected in parallel across the voltage selector.

Therefore, in a D/A converter according to the invention, the first terminal voltage selector and the second terminal voltage selector decode the highest bits ($d_{n-1}$~$d_{n-k}$) of the n-bit digital data to obtain the first reference voltage and the second reference voltage and then voltage selector receives the first reference voltage and the second reference voltage to decide a voltage difference between the first reference voltage and the second reference voltage by inputting the n-k lowest bits of the n-bit digital data in ascending order, thereby obtaining the output voltage of the D/A converter (the voltage value of the second capacitor) according to the following steps:

(a) the first switch and the third switch are turned on while the second switch is turned off, thereby charging the first capacitor and resetting the second capacitor;

(b) the first switch and the third switch are turned off while the second switch is turned on, thereby re-distributing the charges stored in the first capacitor and the second capacitor until the potentials of the first capacitor and the second capacitor are the same;

(c) input the next low bit of the n-bit digital data into the voltage selector and turn on the first switch while the second switch and the third switch are turned off, thereby recharging the first capacitor; and (d) repeat steps (b) and (c) until the input of all low bit of n-bit digital data is completed, and finally, the voltage value of the second capacitor is the output voltage of the D/A converter.

BRIEF DESCRIPTION OF THE DRAWINGS

The present invention will become more fully understood from the detailed description given herein and the accompanying drawings which are given by way of illustration only, and thus do not limit the present invention, and wherein.

DETAILED DESCRIPTION OF THE INVENTION

Figure 1:
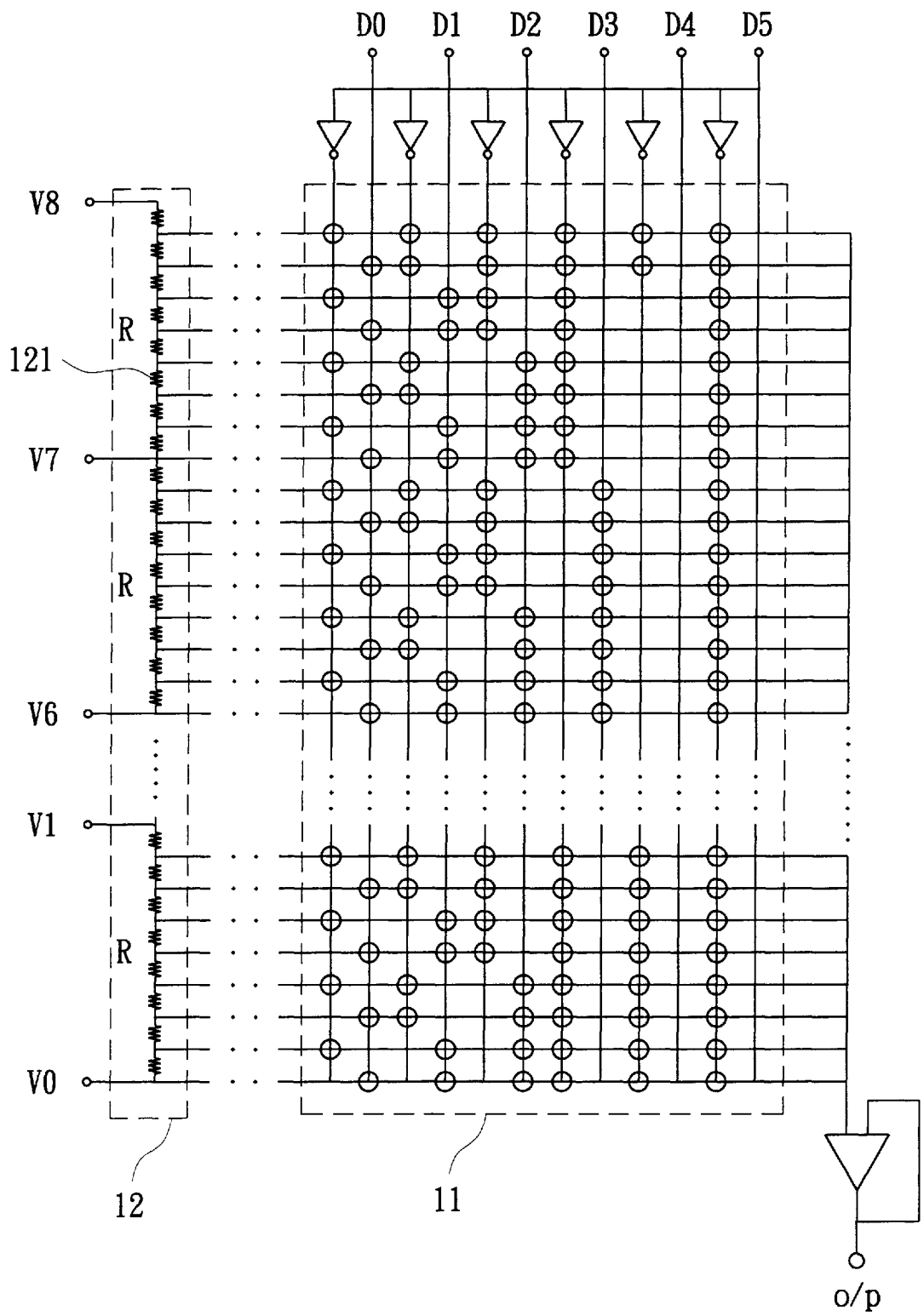
FIG. 1 is a circuit diagram of a conventional R-DAC with a Gamma correction circuit.
Figure 2:
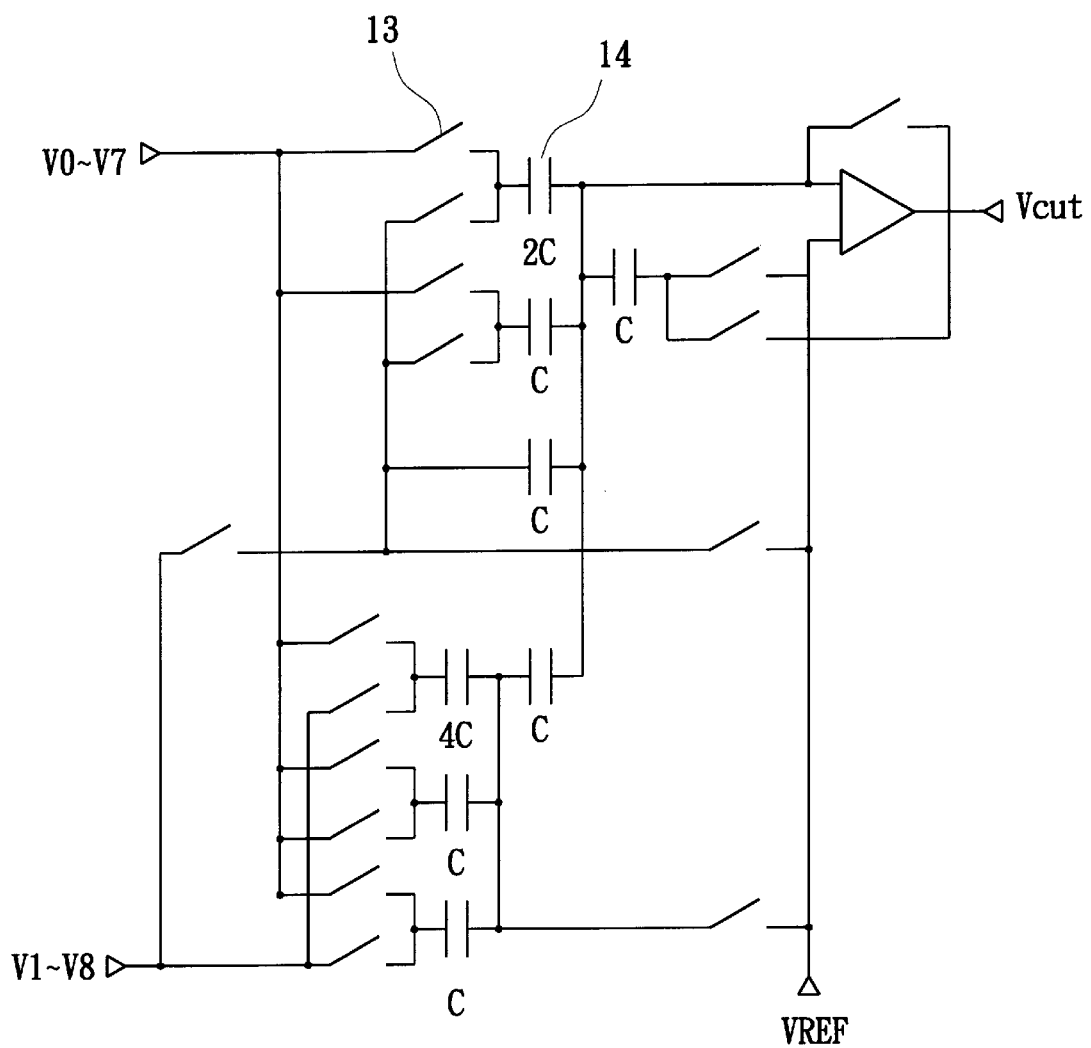
FIG. 2 is a circuit diagram of a conventional 2-divided C-DAC with a Gamma correction circuit.
Figure 3:
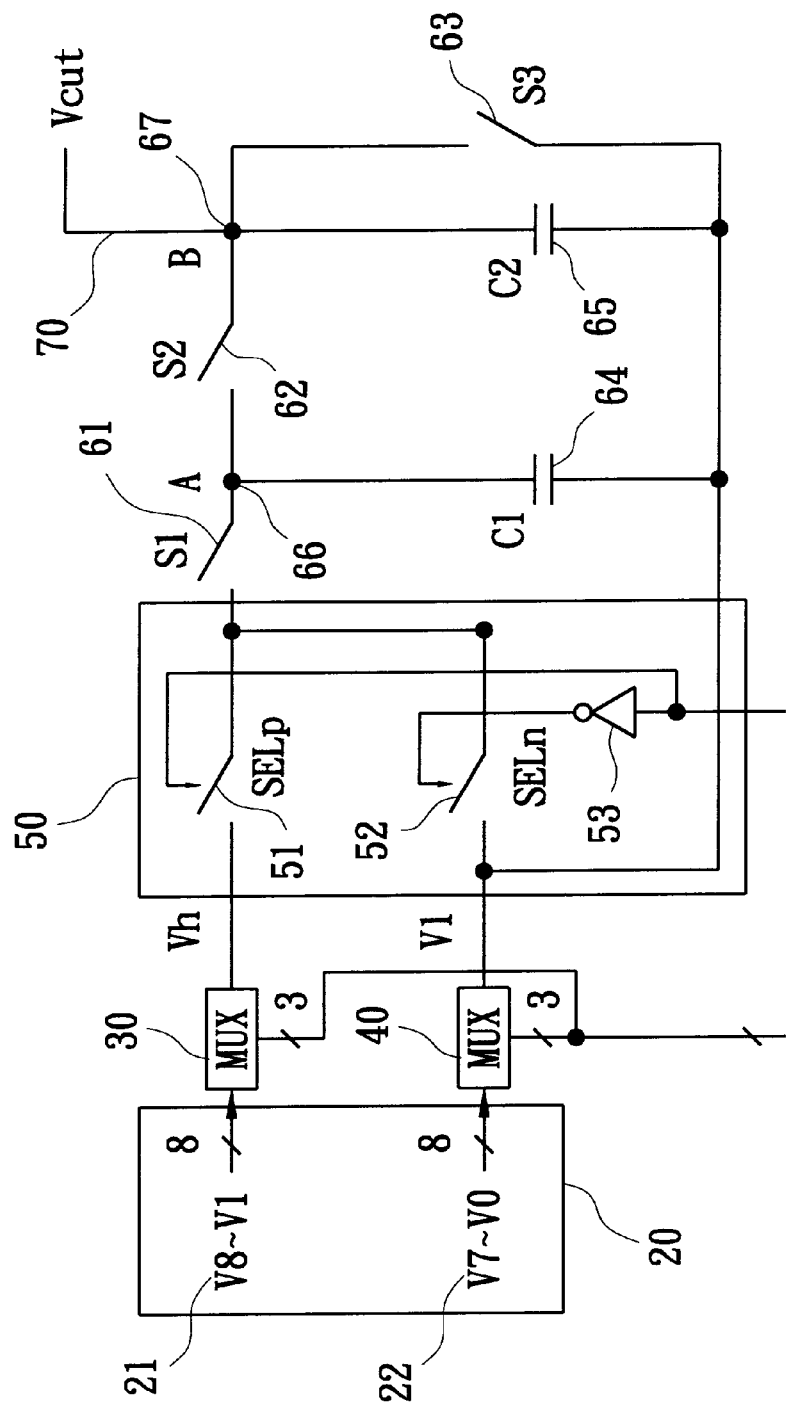
FIG. 3 is a circuit diagram of a D/A converter according to a preferred embodiment of the invention.

FIG. 3 is a circuit diagram illustrating a D/C converter according to a preferred embodiment of the invention. In this embodiment, a D/A converter with 256 (or 2 sup. N) gray levels is provided as an example, wherein its digital data input are 8-bit data [$d_7 d_6 d_5 d_4 d_3 d_2 d_1, d_0$] (or N-bit data [$d_{n-1} \sim d_0$]).

As shown in FIG. 3, a D/A converter with a Gamma correction circuit according to the invention comprises:

a plurality of terminal voltage sources 20, wherein including nine (or $2^k+1$) terminal voltage sources $V_8 \sim V_0$ and further divided into two groups of terminal voltage sources, a first group of terminal voltage sources 21 having $V_8 \sim V_1$ (or $V_{2^k+1} \sim V_1$) and a second group of terminal voltage sources 22 having $V_7 \sim V_0$ (or $V_{2^k} \sim V_0$);

a first terminal voltage selector 30, an eight-to-one (or $2^k$ to 1) multiplexer, the terminals of which are connected to the first group of terminal voltage sources 21, for decoding the three (or k) highest bits [$d_7 \sim d_5$] (or [$d_{n-1} \sim d_{n-k}$] of the N-bit) digital data to obtain a first reference voltage (Vh) from the first group of terminal voltage sources 21;

a second terminal voltage selector 40, an eight-to-one (or $2^k$ to 1) multiplexer, the terminals of which are connected to the second group of terminal voltage sources 22, for decoding the three (or k) highest bits [$d_7 \sim d_5$] (or [$d_{n-1} \sim d_{n-k}$] of the N-bit) digital data to obtain a second reference voltage (Vl) from the second group of terminal voltage sources 22;

a voltage selector 50, the terminals of which receive the first reference voltage and the second reference voltage respectively, including a first selecting switch (SELp) 51, a second selecting switch (SELn) 52 and an inverter 53, wherein a control line coupled to the input terminal of the inverter 53 to control the on/off of the first selecting switch 51 while another control line coupled to the output terminal of the inverter 53 to control the on/off of the second selecting switch 52, and at this time, the five (or N–k lowest bits [$d_4 \sim d_0$] (or [$d_{n-k-1} \sim d_0$] of the n-bit) digital data are input into the input terminal of the inverter 53 in ascending order to obtain a voltage difference $\Delta V$ between the first reference voltage and the second reference voltage, wherein $$\Delta V = Vh - Vl;$$

a first switch (S1) 61, a second switch (S2) 62, and a third switch (S3) 63 connected to each other in series and coupled between the voltage selector 50 and the second reference voltage (Vl);

a first capacitor (C1), which is a charging capacitor, connected in parallel across the voltage selector 50 and connected to a connecting node A 66 of the first switch 61 and the second switch 62; and second capacitor (C2), which is a re-distributing capacitor and the capacitor value of which is the same as that of the first capacitor, connected to a voltage output terminal 70 at a connecting node B 67 of the second switch 62 and the third switch 63 and connected in parallel across the voltage selector 50.

In a D/A converter according to a preferred embodiment of the invention, taking 8-bit digital data for example, after obtaining the first reference voltage (Vh) and the second reference voltage (Vl) by decoding the three highest bits $d_7 \sim d_5$ digital data, the digital-to-analog conversion is performed according to Table 1 and comprises the following steps, wherein "1" denotes an on-state while "0" denotes an off-state.

TABLE 1

| Step | S1 | S2 | S3 | Digital data input | Status of the first capacitor | Status of the second capacitor |
|---|---|---|---|---|---|---|
| 1 | 1 | 0 | 1 | $d_0$ | charged | reset |
| 2 | 0 | 1 | 0 | N.A. | re-distributed | re-distributed |
| 3 | 1 | 0 | 0 | $d_1$ | charged | |
| 4 | 0 | 1 | 0 | N.A. | re-distributed | re-distributed |
| 5 | 1 | 0 | 0 | $d_2$ | charged | |
| 6 | 0 | 1 | 0 | N.A. | re-distributed | re-distributed |
| 7 | 1 | 0 | 0 | $d_3$ | charged | |
| 8 | 0 | 1 | 0 | N.A. | re-distributed | re-distributed |
| 9 | 1 | 0 | 0 | $d_4$ | charged | |
| 10 | 0 | 1 | 0 | N.A. | re-distributed | re-distributed |

Step 1

Input $d_0$ while the first switch 61 and the third switch 63 are turned on and the second switch 62 is turned off, thereby charging the first capacitor C1 until the voltage value of the first capacitor C1 reaches ($\Delta V \times d_0$) and resetting the second capacitor C2;

Step 2

Turn off the first switch 61 and the third switch 63 and turn on the second switch 62 while digital data input is not available, thereby charging the second capacitor C2 by the first capacitor C1 until the potentials of the connecting node A 66 and B 67 are the same. Therefore, the voltage value Vn of the second capacitor C2 can be written as:

$$Vn = C1 \, (\Delta V \times d_0)/(C1+C2) \qquad (1)$$

For C1=C2, equation (1) can be further re-written as:

$$Vn = (\Delta V \times d_0)/2 \qquad (2)$$

Step 3

Input $d_1$ while the first switch 61 is turned on and the second switch 62 and the third switch 63 are turned off, thereby charging the first capacitor C1 again. At this moment, the voltage value of the first capacitor C1 is equal to ($\Delta V \times d_1$);

Step 4

Turn off the first switch 61 and the third switch 63 and turn on the second switch 62 while digital data input is not available, thereby charging the second capacitor C2 by the first capacitor C1 until the potentials of the connecting node A 66 and B 67 are the same. At this point, the voltage value Vn of the second capacitor C2 can be written as:

$$Vn = (((\Delta V \times d_0)/2) + (\Delta V \times d_1))2;$$

Step 5

Input $d_2$ and repeat Step 3, thereby charging the first capacitor C1. At this moment, the voltage value of the first capacitor C1 is equal to ($\Delta V \times d_2$);

Step 6

Repeat Step 4, thereby charging the second capacitor C2 by the first capacitor C1 and obtaining the voltage value Vn of the second capacitor C2 as:

$$Vn = (((((\Delta V \times d_0)/2) + (\Delta V \times d_1))2) + (\Delta V \times d_2))/2;$$

Step 7

Input $d_3$ and repeat Step 3, thereby charging the first capacitor C1. At this moment, the voltage value of the first capacitor C1 is equal to ($\Delta V \times d_3$);

Step 8

Repeat Step 4, thereby charging the second capacitor C2 by the first capacitor C1 and obtaining the voltage value Vn of the second capacitor C2 as:

$$Vn=((((((\Delta V \times d_0)/2)+(\Delta V \times d_1))/2)+(\Delta V \times d_2))/2)+(\Delta V \times d_3))/2;$$

Step 9

Input $d_4$ and repeat Step 3, thereby charging the first capacitor C1. At this moment, the voltage value of the first capacitor C1 is equal to $(\Delta V \times d_4)$; and Step 10

Repeat Step 4, thereby charging the second capacitor C2 by the first capacitor C1 and obtaining the voltage value Vn of the second capacitor C2 as:

$$Vn=((((((((\Delta V \times d_0)/2)+(\Delta V \times d_1))/2)+(\Delta V \times d_2))/2)+(\Delta V \times d_3))/2)+(\Delta V \times d_4))/2 \quad (3)$$

Equation (3) can be further re-written as:

$$Vn=(d_4/2) \times \Delta V+(d_3/4) \times \Delta V+(d_2/8) \times \Delta V+(d_1/16) \times \Delta V+(d_0/32) \times \Delta V \quad (4)$$

As shown in equation (4), the voltage value of the second capacitor C2 is a function of digital data input. In other words, the analog output voltage of the D/A converter according to the invention obtained from the voltage output terminal 70 corresponds to the digital data input.

Furthermore, the comparisons between the C-DAC according to the invention and the conventional 2-divided C-DAC or R-DAC, each with 256 gray levels and an 8-step gamma correction curve, are listed on Table 2.

TABLE 2

|  | Number of resistors | Number of capacitors | Number of MOSs | Number of power source wires |
|---|---|---|---|---|
| R-DAC | 256 | N.A. | 4096 | 256 |
| 2-divided | N.A. | 16 |  | 9 |
| Invention | N.A. | 2 |  | 9 |

As is evident from the above, since R-DAC needs 256 power source wires and 4096 MOSs to form ROM decoder, the area occupied by the elements of R-DAC is far more than that of 2-divided C-DAC. Moreover, since the D/A converter according to the invention needs only one eighth of the elements of the 2-divided C-DAC, the area occupied by the invention is about one eighth of that of the 2-divided C-DAC. Therefore, the problem of occupation is greatly improved.

Figure 4:
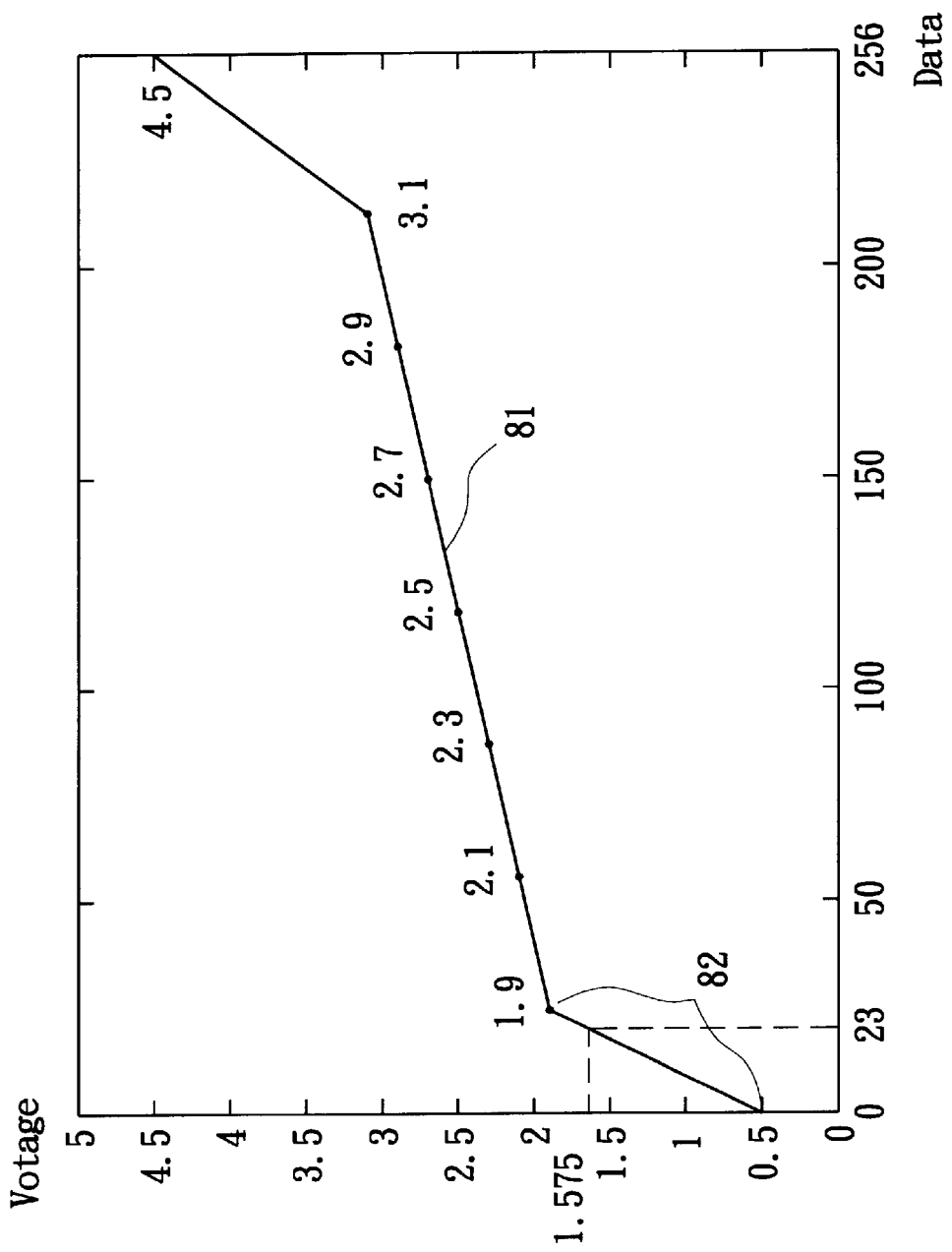
FIG. 4 is a graph illustrating a Gamma correction conversion curve of a DAC with 256 gray levels.

FIG. 4 depicts a conversion curve 81 of a DAC with 256 gray levels, wherein $V_8 \sim V_0$ represents 4.5 V, 3.1 V, 2.9 V, 2.7 V, 2.5 V, 2.3 V, 2.1 V, 1.9 V and 0.5 V respectively. Assume that 8-bit digital data $[d_7d_6d_5d_4d_3d_2d_1d_0]$ are [00010111], and the digital-to-analog conversion is performed according to the process mentioned above, thereby obtaining the reference voltage section 82 between 1.9 V and 0.5 V by decoding the highest bits of the N-bit digital data and then obtaining an output voltage of 1.575 V after completing input of the lowest bits of the n-bit digital data in ascending order.

Although the invention has been disclosed in terms of a preferred embodiment, the disclosure is not intended to limit the invention. Those knowledgeable in the art can make modifications within the scope and spirit of the invention which is determined by the claims below.

What is claimed is:

1. A D/A converter with a Gamma correction circuit for receiving N-bit digital data and then outputting a corresponding analog output voltage, comprising:

a plurality of terminal voltage sources;

a first terminal voltage selector for obtaining a first reference voltage from said terminal voltage sources according to the k highest bits of said N-bit digital data;

a second terminal voltage selector for obtaining a second reference voltage from said terminal voltage sources according to the k highest bits of said N-bit digital data;

a voltage selector for obtaining a voltage difference between said first reference voltage and said second reference voltage according to the N–k lowest bits of said N-bit digital data;

a first switch, a second switch and a third switch connected to each other in series and coupled between said voltage selector and said second reference voltage;

a first capacitor connected in parallel across said voltage selector and charged by said voltage difference while said first switch is turned on; and a second capacitor connected in parallel across said first capacitor and the charges of said first capacitor and said second capacitor are re-distributed to obtain said analog output voltage while said first switch and said third switch are turned off and said second switch is turned on.

2. A D/A converter as claimed in claim 1, where is the capacitor of said first capacitor and said second capacitor are the same.

3. A D/A converter as claimed in claim 1, wherein said second capacitor is reset while said first switch and said third switch are turned on.

4. A D/A converter as claimed in claim 1, wherein said first terminal voltage selector and said second terminal voltage selector can be a multiplexer.

5. A D/A converter as claimed in claim 1, wherein said voltage selector further includes:

an inverter, which receives the N–k lowest bits of said N-bit digital data in ascending order;

a first selecting switch for obtaining said first reference voltage according to the N–k lowest bits of said N-bit digital data; and a second selecting switch for obtaining said second reference voltage according to the N–k lowest bits of said N-bit digital data which is outputted from said inverter.

6. A D/A converter as claimed in claim 1, wherein the operations of said first switch through said third switch are as follows:

(a) said first switch and said third switch are turned on while said second switch is turned off according to the first bit of the N–k lowest bits of said N-bit digital data, thereby charging said first capacitor and resetting said second capacitor;

(b) turn off said first switch and said third switch while turn on said second switch after said first capacitor is fully charged, thereby re-distributing the charges stored in said first capacitor and said second capacitor;

(c) input the next bit of the N–k lowest bits of said N-bit digital data into said voltage selector and turn on said first switch while said second switch and said third switch are turned off, thereby charging said first capacitor again; and (d) repeat (b) and (c) until the input of the N–k lowest bits of said N-bit digital data into said voltage selector is completed, thereby obtaining said analog output voltage corresponding to said N-bit digital data.

7. A D/A converter as claimed in claim 1, wherein the number of said terminal voltage sources is $2^k+1$.

8. A D/A converter as claimed in claim 1, wherein said terminal voltage sources further divided into two groups of terminal voltage sources, $V_{2^k} \sim V_1$ and $V_{2^k-1} \sim V_0$.

9. A D/A converter as claimed in claim 1, wherein said first terminal voltage selector for obtaining said first reference voltage from said group of terminal voltage sources of $V_{2^k} \sim V_1$ according to the highest k bits of said N-bit digital data.

10. A D/A converter as claimed in claim 1, wherein said second terminal voltage selector for obtaining said second reference voltage from said group of terminal voltage sources of $V_{2^k-1} \sim V_0$ according to the highest k bits of said N-bit digital data.

* * * * *